United States Patent
Cheng

(10) Patent No.: US 9,640,624 B2
(45) Date of Patent: May 2, 2017

(54) SEMICONDUCTOR DEVICE AND MANUFACTURING METHOD THEREFOR

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 0 days.

(21) Appl. No.: 14/896,364

(22) PCT Filed: Jan. 6, 2014

(86) PCT No.: PCT/CN2014/070150
§ 371 (c)(1),
(2) Date: Dec. 4, 2015

(87) PCT Pub. No.: WO2014/194669
PCT Pub. Date: Dec. 11, 2014

(65) Prior Publication Data
US 2016/0126325 A1    May 5, 2016

(30) Foreign Application Priority Data
Jun. 6, 2013  (CN) .......................... 2013 1 0223571

(51) Int. Cl.
*H01L 29/40* (2006.01)
*H01L 29/66* (2006.01)
(Continued)

(52) U.S. Cl.
CPC .......... *H01L 29/402* (2013.01); *H01L 21/283* (2013.01); *H01L 21/31* (2013.01);
(Continued)

(58) Field of Classification Search
CPC . H01L 29/872; H01L 29/2003; H01L 29/417; H01L 29/423; H01L 29/42316;
(Continued)

(56) References Cited

U.S. PATENT DOCUMENTS

| 6,541,809 B1 | 4/2003 | Sandhu et al. |
| 2002/0006727 A1 | 1/2002 | Pyo |

(Continued)

FOREIGN PATENT DOCUMENTS

| CN | 1983628 A | 6/2007 |
| CN | 101162695 A | 4/2008 |

(Continued)

OTHER PUBLICATIONS

Written opinion of the International Search Authority for PCT/CN2014/070150; mailed Mar. 27, 2014.
(Continued)

*Primary Examiner* — Tucker J Wright
(74) *Attorney, Agent, or Firm* — Zareefa B. Flener; Flener IP Law

(57) ABSTRACT

A semiconductor device comprises: a semiconductor device active region; an electrode shape controlling layer disposed on the semiconductor device active region, the electrode shape controlling layer containing aluminum, the content of aluminum being changed in a direction from bottom to up from the semiconductor device active region, an electrode region being disposed on the electrode shape controlling layer, a groove extended toward the semiconductor device active region and penetrating through the electrode shape controlling layer longitudinally being disposed in the electrode region, all or part of a side surface of the groove having a shape corresponding to the content of aluminum in the electrode shape controlling layer; and an electrode disposed in the groove in the electrode region entirely or partially, the
(Continued)

electrode having a shape matching with the shape of the groove, a bottom portion of the electrode being contacted with the semiconductor device active region.

20 Claims, 13 Drawing Sheets

(51) Int. Cl.
| | |
|---|---|
| H01L 29/778 | (2006.01) |
| H01L 29/868 | (2006.01) |
| H01L 29/872 | (2006.01) |
| H01L 29/20 | (2006.01) |
| H01L 21/283 | (2006.01) |
| H01L 21/31 | (2006.01) |
| H01L 21/311 | (2006.01) |
| H01L 21/3213 | (2006.01) |
| H01L 29/417 | (2006.01) |
| H01L 29/423 | (2006.01) |
| H01L 29/78 | (2006.01) |
| H01L 29/861 | (2006.01) |
| H01L 29/41 | (2006.01) |
| H01L 21/768 | (2006.01) |

(52) U.S. Cl.
CPC .. *H01L 21/31116* (2013.01); *H01L 21/32139* (2013.01); *H01L 29/2003* (2013.01); *H01L 29/401* (2013.01); *H01L 29/41* (2013.01); *H01L 29/417* (2013.01); *H01L 29/41725* (2013.01); *H01L 29/42352* (2013.01); *H01L 29/42356* (2013.01); *H01L 29/66136* (2013.01); *H01L 29/66143* (2013.01); *H01L 29/66462* (2013.01); *H01L 29/66681* (2013.01); *H01L 29/7787* (2013.01); *H01L 29/7823* (2013.01); *H01L 29/868* (2013.01); *H01L 29/8611* (2013.01); *H01L 29/872* (2013.01); *H01L 21/76804* (2013.01)

(58) Field of Classification Search
CPC ........... H01L 29/42356; H01L 29/4236; H01L 29/66704
See application file for complete search history.

(56) References Cited

U.S. PATENT DOCUMENTS

| | | |
|---|---|---|
| 2006/0115938 A1 | 6/2006 | Wu et al. |
| 2006/0286739 A1 | 12/2006 | Rossi et al. |
| 2007/0132037 A1 | 6/2007 | Hoshi et al. |
| 2010/0159656 A1 | 6/2010 | Nakata et al. |
| 2011/0089468 A1 | 4/2011 | Zhang |

FOREIGN PATENT DOCUMENTS

| | | |
|---|---|---|
| CN | 101312207 A | 11/2008 |
| CN | 101320750 A | 12/2008 |
| CN | 102130158 A | 7/2011 |
| JP | 2008306083 A | 12/2008 |
| JP | 2010067690 A | 3/2010 |
| KR | 20020002700 A | 1/2002 |
| WO | 2006057686 A2 | 6/2006 |

OTHER PUBLICATIONS

International Search Report for PCT/CN2014/070150; mailed Mar. 27, 2014.
Written opinion of the Japanese Patent Office (JPO) for JP-2016-517130 (related application claiming same priority date as present application), prepared by Examiner Kawai, Toshihide; mailed Dec. 30, 2016.
Written opinion of the IP Office of Singapore (IPOS) for SG11201510008 (related application claiming same priority date as present application), prepared by Officer Leong Hoi Liong; mailed Jul. 26, 2016.
International Search Report for SG11201510008 (related application claiming same priority date as present application), prepared by Officer Leong Hoi Liong; mailed Jul. 25, 2016.

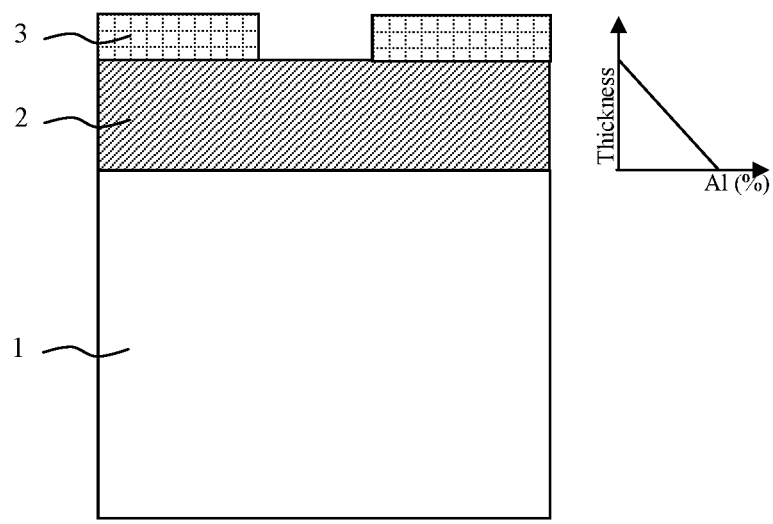
FIG. 3C
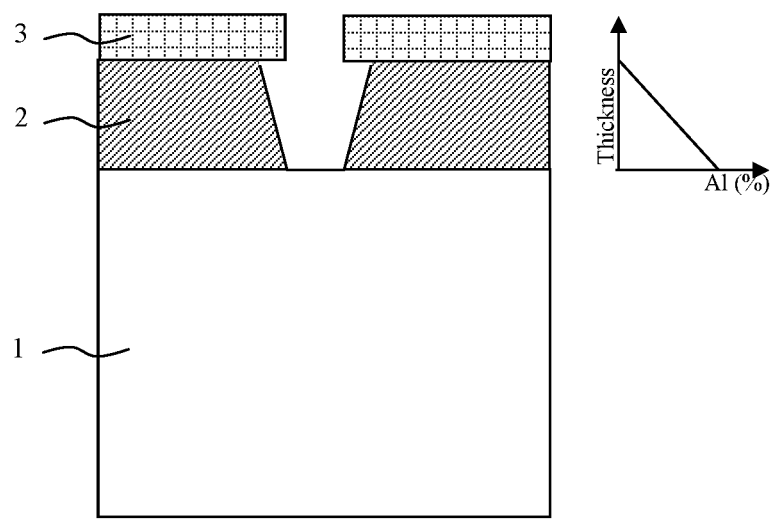
FIG. 3D1

SEMICONDUCTOR DEVICE AND MANUFACTURING METHOD THEREFOR

CROSS-REFERENCE TO RELATED APPLICATIONS

The present application is a National Phase Patent Application of International Application No. PCT/CN2014/070150, filed on Jan. 6, 2014, which claims priority to Chinese Patent Application No. 201310223571.7, filed on Jun. 6, 2013, in the State Intellectual Property Office of China, and entitled "Semiconductor Device and Manufacturing Method therefor", which are incorporated by reference herein in their entirety.

TECHNICAL FIELD

The present invention relates to semiconductor technique, and more particularly to a semiconductor device and a manufacturing method therefor.

BACKGROUND

In the field of semiconductor devices, how to distribute electric field intensity and how to avoid excessive local electric field intensity must be taken into account in design of semiconductor devices in order to increase breakdown voltages of devices and improve reliability of devices. Electric field distribution can be controlled by many ways, for example, modulating and doping active regions, adding field plates to reduce the maximum values of electric fields, and controlling shapes of electrodes to restrain electric field distribution.

For example, for a GaN-based high electron mobility transistor which is a kind of flat-channel field effect transistors, control of gate shape is one of the very important device manufacturing processes. A planar structure of a high electron mobility transistor will cause non-uniform distribution of electric field intensity. Especially when a high voltage exists between a source and a drain, a very high electric field intensity will occur at edges of a gate which are adjacent to the drain. FIG. 1 shows distribution of electric field intensity between a source and a drain during operation of a GaN-based high electron mobility transistor. It could be seen that there is a very high electric field intensity at edges of the gate which are adjacent to the drain, the device will be breakdown once the peak electric field exceeds a critical electric field of the GaN material. Since the withstand voltage of the device is integration of the electric field intensity between the gate and the drain, compared with an electric field having uniform distribution, the higher the electric field intensity at the edges of the gate is, the smaller the withstand voltage is. This phenomenon will greatly degrade device performances, such as breakdown voltages and reliability of devices.

For a Schottky diode, there is a local maximum value in an electric field at edges of the electrodes, there is a need to build a field plate or form a depletion layer at the edges in order to improve electric field distribution.

For a Laterally Diffused Metal Oxide Semiconductor (LDMOS) having a planar structure or a Metal-Oxide-Semiconductor Field-Effect Transistor (MOSFET) having a vertical structure, such as a U-shaped trench MOSFET (UMOSFET), there is a peak electric field at edges of electrodes, it is also necessary to control shapes of the electrodes or add field plates at the edges to improve electric field distribution. For a UMOS or a Vertically Diffused Metal Oxide Semiconductor (VDMOS) having a vertical structure, the electric field at the edges also needs to be controlled.

In order to change distribution of electric field intensity and improve operation performances of devices, electric field distribution can be controlled by many ways, for example, modulating and doping active regions, using field plates to reduce the maximum values of electric fields, and controlling the shapes of the electrodes to restrain electric field distribution.

Field plates are used to expand a horizontal depletion region of a planar device through vertical depletion for the active region of the planar device, causing change of distribution of electric field intensity of the planar device. The field plates can be disposed at a source, a gate or a drain. One or more than one field plate can be used in a device to change distribution of electric field intensity and reduce the maximum electric field intensity at edges of the gate which are adjacent to the drain. As a gate with a T shape, a T-gate is used to change distribution of electric field intensity with its own shape feature.

In processes of manufacturing field plates and T-gates, a dielectric layer is essential. The most common dielectric layers are made of silicon nitride. Due to limitation of manufacturing processes, it is difficult to implement a field plate having a complicated shape. That is, the processes may be very complicated, or there is no such a process which can achieve it. Similarly, due to limitation of manufacturing processes, the shapes of gates are always simple and it is difficult to manufacture gates having various shapes. That is, the processes may be very complicated, or there is no such a process which can achieve it. Thus it is required to develop new manufacturing processes to achieve field plates having complicated shapes and gates having various shapes.

Therefore, in order to address the above-mentioned technical problems, it is necessary to provide a semiconductor device and a manufacturing method therefor.

SUMMARY

In view of this, the present invention has been made in an effort to provide a novel semiconductor device and a manufacturing method therefor, so as to realize electrodes having various shapes with new manufacturing processes.

In this invention, an electrode shape controlling layer is added. The electrode shape controlling layer contains aluminum, and the content of aluminum in the layer is adjustable. When the electrode shape controlling layer is etched, the horizontal etching speed and the vertically etching speed vary based on the content of aluminum, so that the etching cross-sectional shape can be controlled and etching cross-sections with various shapes can be designed and made. In this way, electrodes having various shapes can be manufactured after deposition of the electrodes, so that control of shapes of electrodes can be realized.

The content of aluminum in the electrode shape controlling layer is adjusted to be gradually reduced from bottom to up. For example, when the reduction is linear reduction, the sides of a groove are straight slopes, the etching cross-sectional shape is a trapezoid, the electrode has a trapezoidal cross-section after deposition of the electrode, and distribution of the peak values of the electric field is dispersed. When the reduction is decelerating reduction, the sides of the groove are concave slopes protruding away from a central line of the groove, the etching cross-sectional shape is a U shape, the electrode has a U cross-sectional shape after deposition of the electrode, and the electric field distribution near the edges of the electrode is changed correspondingly and becomes gentle. When the reduction is accelerating reduction, the sides of the groove are convex slopes protruding to the central line of the groove, the electrode has a cross-sectional shape matching with the side of the groove after deposition of the electrode, and the electric field distribution near the edges of the electrode is changed correspondingly and becomes gentle.

In order to achieve the above objects, embodiments of the present invention provide technical schemes as follows.

A semiconductor device, comprising:

a semiconductor device active region;

an electrode shape controlling layer disposed on the semiconductor device active region, the electrode shape controlling layer containing aluminum, the content of aluminum in all or part of the electrode shape controlling layer being reduced in a direction from bottom to up from the semiconductor device active region, an electrode region being disposed on the electrode shape controlling layer, a groove extended toward the semiconductor device active region and penetrating through the electrode shape controlling layer longitudinally being disposed in the electrode region, all or part of a side surface of the groove having a shape of one of a straight slope, a concave slope protruded away from a central line of the groove and a convex slope protruded toward the central line of the groove; and an electrode disposed in the groove in the electrode region entirely or partially, the electrode having a shape matching with the shape of the groove, a bottom portion of the electrode being contacted with the semiconductor device active region.

Preferably, the electrode shape controlling layer is one or a combination of a semiconductor layer and a first dielectric layer.

Preferably, a semiconductor layer in the semiconductor device active region and the semiconductor layer in the electrode shape controlling layer are formed of one of Group III nitride, silicon, germanium, silicon germanium, III-IV compound and oxide or a combination thereof.

Preferably, the first dielectric layer is formed of one of SiN, SiAlN, SiAlGaN, SiAlOx, AlMgON and HfAlOx or a combination thereof.

Preferably, the electrode shape controlling layer is a combination of the semiconductor layer and the first dielectric layer, the first dielectric layer is located above the semiconductor layer, the content of aluminum at any position of the semiconductor layer is greater than that at any position of the first dielectric layer.

Preferably, the content of aluminum in all or part of the electrode shape controlling layer is reduced in the direction from bottom to up from the semiconductor device active region in a manner of one of linear reduction, accelerating reduction, decelerating reduction, initial linear reduction and then remaining unchanged, initial decelerating reduction and then remaining unchanged, and initial accelerating reduction and then remaining unchanged.

Preferably, the groove in the electrode shape controlling layer is extended into the semiconductor device active region.

Preferably, a second dielectric layer is deposited on all or part of inner walls of the groove in the electrode shape controlling layer and a surface of the electrode shape controlling layer, the electrode is located on the second dielectric layer entirely or partially.

Preferably, the second dielectric layer is formed of one of $Al_2O_3$, AlON, SiN, SiON, $SiO_2$, HfAlOx, $HfO_2$ or a combination thereof.

Preferably, the semiconductor device is a diode or a transistor, the electrode is an anode electrode or a cathode electrode of the diode, or the electrode is one of a source electrode, a drain electrode and a gate electrode of the transistor.

Preferably, the semiconductor device active region comprises one of a high electron mobility transistor having an aluminum gallium nitride/gallium nitride heterojunction structure, a high electron mobility transistor having an aluminum gallium indium nitrogen/gallium nitride heterojunction structure, a high electron mobility transistor having a nitride aluminum/gallium nitride heterojunction structure, a gallium nitride MOSFET, a multi quantum well device having indium gallium nitride/gallium nitride, a light emitting diode made of p-type nitride, an Ultraviolet Light Emitting Diode (UV-LED), a photodetector, a hydrogen generator, a solar cell, an LDMOS, a UMOSFET, a diode, a Schottky diode and an avalanche breakdown diode.

Correspondingly a method of manufacturing a semiconductor device is provided, comprising:

S1. providing a semiconductor device active region;

S2. forming an electrode shape controlling layer on the semiconductor device active region, the electrode shape controlling layer containing aluminum, the content of aluminum in all or part of the electrode shape controlling layer being reduced in a direction from bottom to up from the semiconductor device active region, an electrode region being disposed on the electrode shape controlling layer;

S3. forming a groove extended toward the semiconductor device active region and penetrating through the electrode shape controlling layer longitudinally in the electrode region, all or part of a side surface of the groove having a shape of one of a straight slope, a concave slope protruded away from a central line of the groove and a convex slope protruded toward the central line of the groove; and S4. forming an electrode in the groove in the electrode region, the electrode being disposed in the groove in the electrode region entirely or partially, the electrode having a shape matching with the shape of the groove, a bottom portion of the electrode being contacted with the semiconductor device active region.

Preferably, steps S3 and S4 comprise:

S31. applying a first mask layer on the electrode shape controlling layer, and exposing the electrode region through photolithography;

S32. etching the electrode region so as to form the groove extended to the semiconductor device active region;

S33. removing the first mask layer;

S41. applying a second mask layer on the electrode shape controlling layer, exposing the electrode region through photolithography; and S42. depositing the electrode, removing the second mask layer to form the electrode. Preferably, in step S2, the electrode shape controlling layer is one or a combination of a semiconductor layer and a first dielectric layer, the first dielectric layer is grown with one of Metal Organic Chemical Vapor Deposition (MOCVD), Plasma Enhanced Chemical Vapor Deposition (PECVD), Liquid Phase Chemical Vapor Deposition (LPCVD), Molecular Beam Epitaxy (MBE), Chemical Vapor Deposition (CVD) and Gas Cluster Ion Beams (GCIB).

Preferably, before step S4, the method further comprises:

depositing a second dielectric layer on all or part of inner walls of the groove in the electrode shape controlling layer and a surface of the electrode shape controlling layer, the second dielectric layer is formed of one of $Al_2O_3$, AlON, SiN, SiON, $SiO_2$, HfAlOx, $HfO_2$ or a combination thereof.

In the semiconductor devices and manufacturing methods thereof according to the present invention, an electrode shape controlling layer is added on the semiconductor device active region, and the content of aluminum in the electrode shape controlling layer varies based on change of thickness. By controlling change of the content of aluminum in the electrode shape controlling layer, the ratio of the horizontal etching speed to the vertically etching speed is controlled in the etching process, so that the etching cross-sectional shape is changed in the etching process. In this way, shapes of electrodes can be controlled during the process of manufacturing the electrodes, control of various shapes of electrodes can be realized in the processes.

Since the etching speed is controlled by the material, there is no need to change the process parameters in the etching process, so good controllability, repeatability and simplicity can be realized. In addition, some particular shapes which cannot be realized with current etching processes can be realized with this invention. By controlling the shapes of the electrodes, distribution of electric field intensity near the electrodes is changed, therefore performances of the semiconductor device, such as breakdown voltage and reliability, are improved.

BRIEF DESCRIPTION OF DRAWINGS

In order to illustrate embodiments of the present invention or the prior art more clearly, hereinafter a simple introduction is made to the accompanying drawings used in the description for the embodiments or the prior art. It is obvious for those skilled in the art that the accompanying drawings just illustrate some embodiments of the present invention, and other accompanying drawings can be obtained based on the current accompanying drawings without inventive work. In the drawings:

FIGS. 3A to 3G are schematic views showing a method of manufacturing the semiconductor device according to the first embodiment of the present invention;

DETAILED DESCRIPTION

Figure 1:
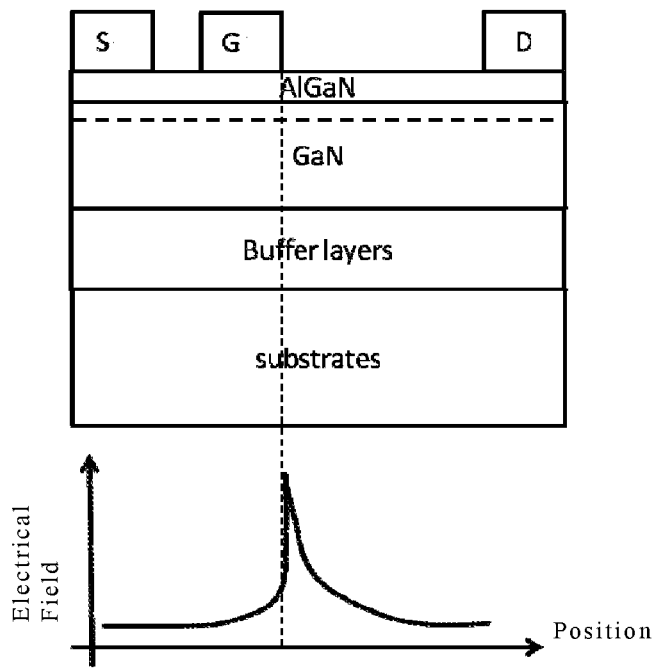
FIG. 1 is a schematic view showing distribution of electric field intensity between a source and a drain during operation of a GaN-based high electron mobility transistor.

This invention will be described in detail thereinafter with reference to the specific embodiments in conjunction with the accompanying drawings. However, this invention is not limited to the embodiments, rather, any modification on structures, methods or functions by those skilled in the art based on these embodiments is included within the scope of this invention.

In addition, like reference numerals may be used in different embodiments. Such a repeat is just for simple and clear description of this invention, and does not imply that there is any correlation between the different embodiments and/or structures.

An embodiment of the present invention provides a semiconductor device, comprising:

a semiconductor device active region;

an electrode shape controlling layer disposed on the semiconductor device active region, the electrode shape controlling layer containing aluminum, the content of aluminum in all or part of the electrode shape controlling layer being reduced in a direction from bottom to up from the semiconductor device active region, an electrode region being disposed on the electrode shape controlling layer, a groove extended toward the semiconductor device active region and penetrating through the electrode shape controlling layer longitudinally being disposed in the electrode region, all or part of a side surface of the groove having a shape of one of a straight slope, a concave slope protruded away from a central line of the groove and a convex slope protruded toward the central line of the groove; and an electrode disposed in the groove in the electrode region entirely or partially, the electrode having a shape matching with the shape of the groove, a bottom portion of the electrode being contacted with the semiconductor device active region.

Correspondingly, the present invention also provides a method of manufacturing a semiconductor device, comprising:

S1. providing a semiconductor device active region;

S2. forming an electrode shape controlling layer on the semiconductor device active region, the electrode shape controlling layer containing aluminum, the content of aluminum in all or part of the electrode shape controlling layer being reduced in a direction from bottom to up from the semiconductor device active region, an electrode region being disposed on the electrode shape controlling layer;

S3. forming a groove extended toward the semiconductor device active region and penetrating through the electrode shape controlling layer longitudinally in the electrode region, all or part of a side surface of the groove having a shape of one of a straight slope, a concave slope protruded away from a central line of the groove and a convex slope protruded toward the central line of the groove; and S4. forming an electrode in the groove in the electrode region, the electrode being disposed in the groove in the electrode region entirely or partially, the electrode having a shape matching with the shape of the groove, a bottom portion of the electrode being contacted with the semiconductor device active region.

Hereinafter this invention will be described in more detail with reference to various embodiments.

The First Embodiment

Figure 2:
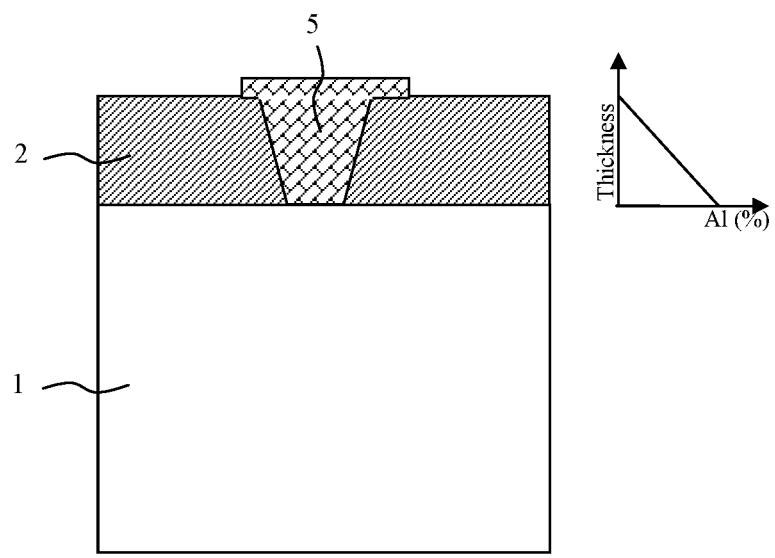
FIG. 2 is a schematic structural view of a semiconductor device according to a first embodiment of the present invention.

FIG. 2 shows a schematic structural view of a semiconductor device according to the first embodiment of the present invention. As shown in FIG. 2, a semiconductor device according to this embodiment comprises:

a semiconductor device active region 1;

an electrode shape controlling layer 2 disposed on the semiconductor device active region 1, the electrode shape controlling layer containing aluminum, the content of aluminum being reduced in a direction from bottom to up from the semiconductor device active region, the reduction being linear reduction, an electrode region being disposed on the electrode shape controlling layer 2, a groove being disposed in the electrode region, the groove being extended toward the semiconductor device active region and penetrating through the electrode shape controlling layer, the groove having a shape of an inverted trapezoid and the sides of the groove being straight slopes; and an electrode 5 disposed in the groove in the electrode region, the electrode 5 having a shape matching with the shape of the groove, the electrode 5 being contacted with the semiconductor device active region 1.

In this embodiment, a part of the electrode 5 is disposed inside the groove and another part thereof is above the groove.

Figure 3A:
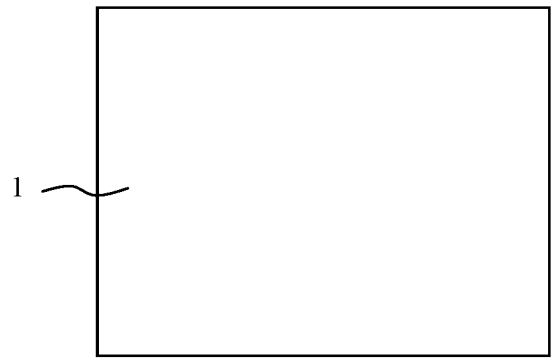
Figure 3B:
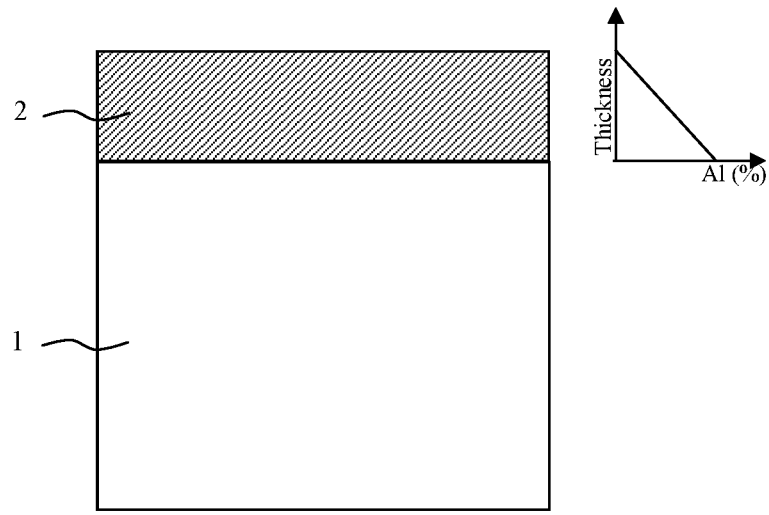
Figure 3E:
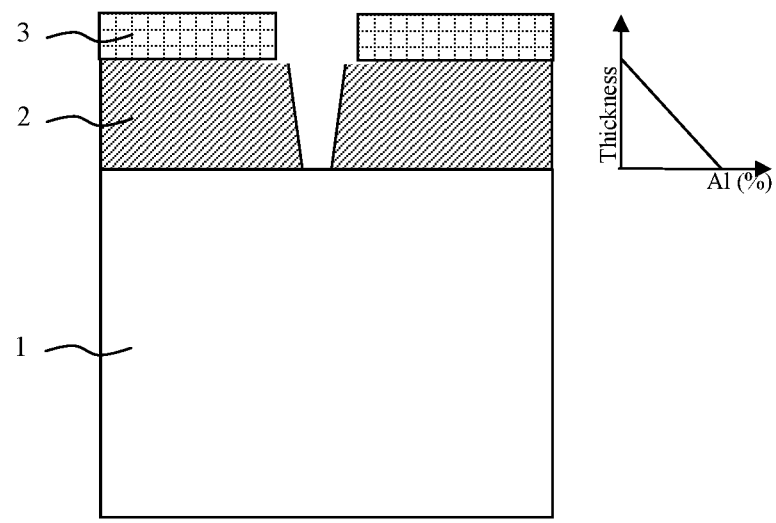
Figure 3E:
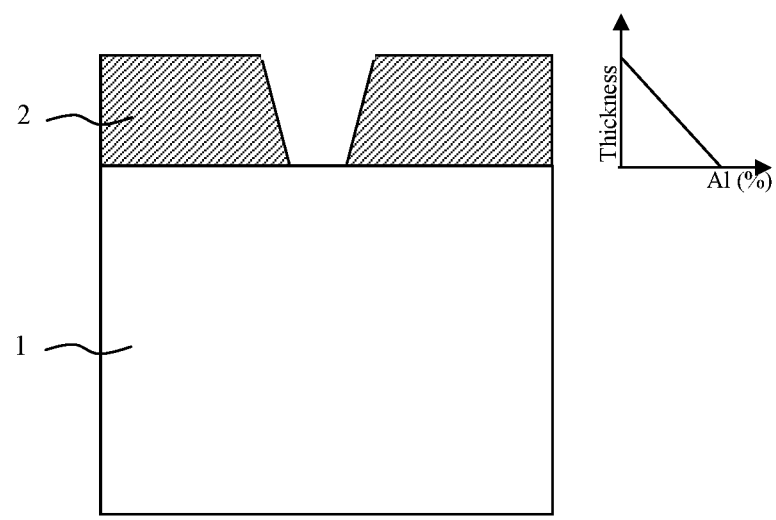
Figure 3F:
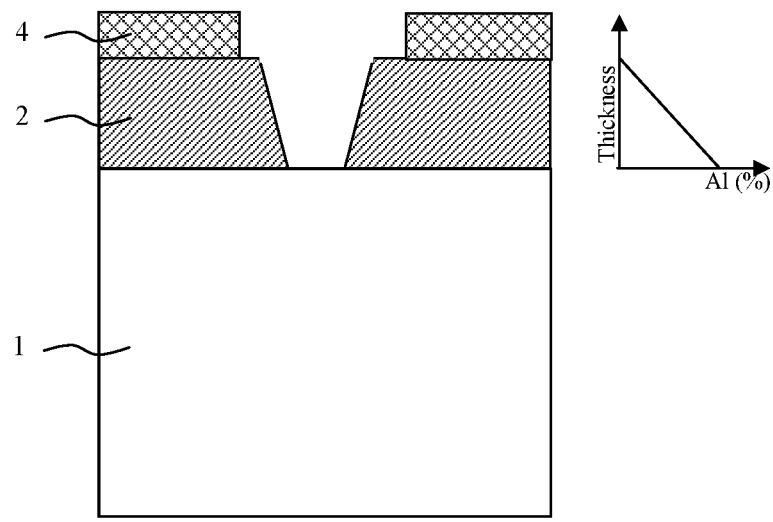
Figure 3G:
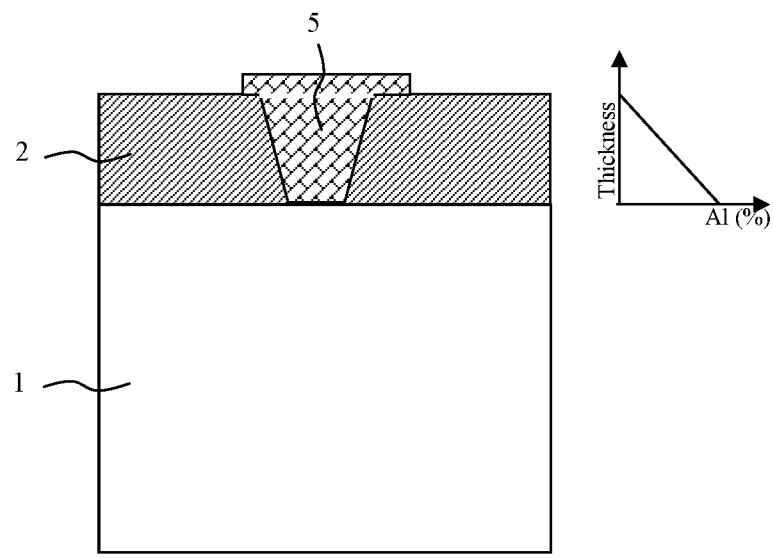

Referring to FIGS. 3A-3G, a method of manufacturing a semiconductor device according to this embodiment comprises:

providing a semiconductor device active region 1, as shown in FIG. 3A;

forming an electrode shape controlling layer 2 on the semiconductor device active region 1, the content of aluminum in the electrode shape controlling layer being reduced in a direction from bottom to up, the reduction being linear reduction, an electrode region being disposed on the electrode shape controlling layer, as shown in FIG. 3B;

applying a first mask layer 3 on the electrode shape controlling layer 2, and exposing the electrode region through photolithography, as shown in FIG. 3C;

etching the electrode region so as to form a groove extended toward the semiconductor device active region, the groove penetrating through the electrode shape controlling layer 2 at least partially, the shape of the groove varying based on change of the content of aluminum in the electrode shape controlling layer 2, the feature size of the groove being adjustable by an etching process, as compared with the feature sizes by photolithography, the feature size of the groove being slightly larger or smaller than the feature size by photolithography, as shown in FIGS. 3D1 and 3D2;

removing the first mask layer 3, as shown in FIG. 3E;

applying a second mask layer 4 through photolithography to expose the electrode region, as shown in FIG. 3F; and depositing the electrode, removing the second mask layer 4 to form an electrode 5, as shown in FIG. 3G.

In this embodiment, the content of aluminum in the electrode shape controlling layer is gradually reduced in the direction from bottom to up, and the reduction is linear. The sides of the groove are straight slopes. The etching cross-sectional shape is a trapezoid. After deposition of the electrode, the electrode has a cross-section shape of a trapezoid, so that the distribution of the electric field at the edges of the electrode varies linearly and the distribution of the peak values of the electric field is dispersed.

In this embodiment, the electrode shape controlling layer 2 may be one or a combination of a semiconductor layer and a first dielectric layer. The semiconductor layer is formed of one of Group III nitride, silicon, germanium, silicon germanium, III-IV compound and oxide or a combination thereof. The first dielectric layer is formed of one of SiN, SiAlN, SiAlGaN, SiAlOx, AlMgON and HfAlOx or a combination thereof. The first dielectric layer may be grown with MOCVD, PECVD, LPCVD, MBE, CVD or GCIB.

If the electrode shape controlling layer 2 includes a semiconductor layer and a first dielectric layer, the first dielectric layer is located above the semiconductor layer. The content of aluminum at any position of the semiconductor layer is greater than that at any position of the first dielectric layer. Overall the content of aluminum in the electrode shape controlling layer is gradually reduced in the direction from bottom to up from the semiconductor device active region.

In this embodiment, the semiconductor device active region comprises one of a high electron mobility transistor having an aluminum gallium nitride/gallium nitride heterojunction structure, a high electron mobility transistor having an aluminum gallium indium nitrogen/gallium nitride heterojunction structure, a high electron mobility transistor having a nitride aluminum/gallium nitride heterojunction structure, a gallium nitride MOSFET, a multi quantum well device having indium gallium nitride/gallium nitride, a light emitting diode made of p-type nitride, a UV-LED, a photodetector, a hydrogen generator, a solar cell, an LDMOS, a UMOSFET, a diode, a Schottky diode and an avalanche breakdown diode.

Further, a second dielectric layer may be deposited on all or part of side surfaces of the groove in the electrode shape controlling layer 2 and a surface of the electrode shape controlling layer 2, the electrode is disposed on the second dielectric layer partially or entirely. The second dielectric layer may be formed of one of $Al_2O_3$, AlON, SiN, SiON, $SiO_2$, HfAlOx, $HfO_2$ or a combination thereof, and may be deposited with PECVD, LPCVD, CVD, Atomic-Layer Deposition (ALD), MOCVD or Physical Vapor Deposition (PVD).

The Second Embodiment

Figure 4A:
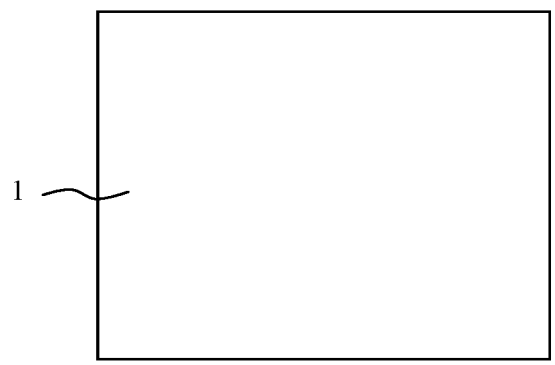
FIGS. 4A to 4H are schematic views showing a method of manufacturing the semiconductor device according to a second embodiment of the present invention.
Figure 4B:
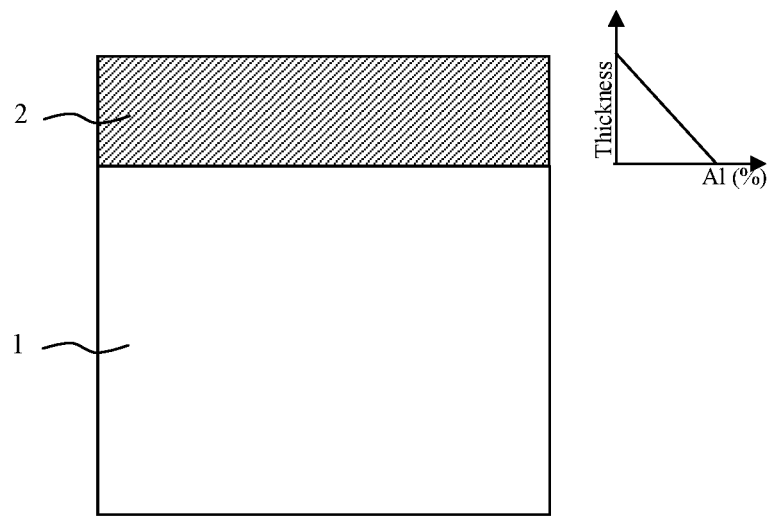
Figure 4C:
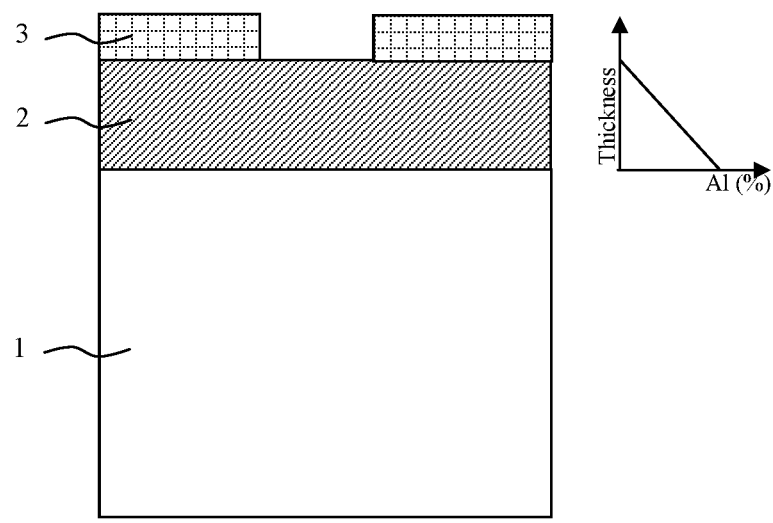
Figure 4D:
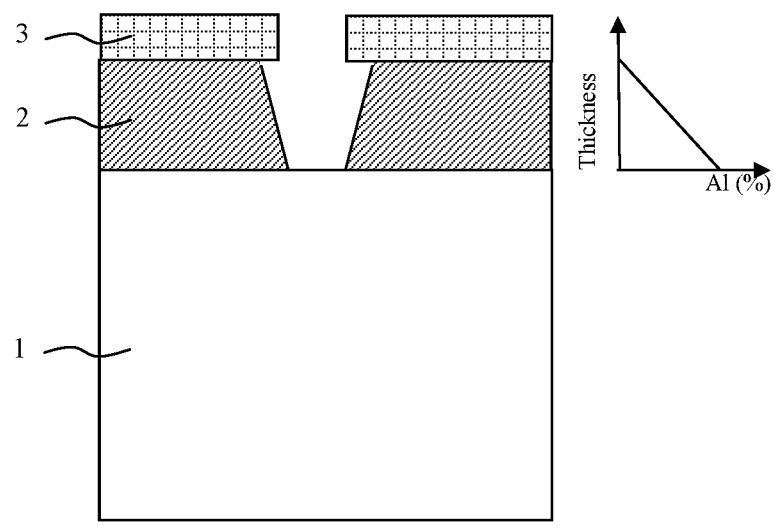
Figure 4E:
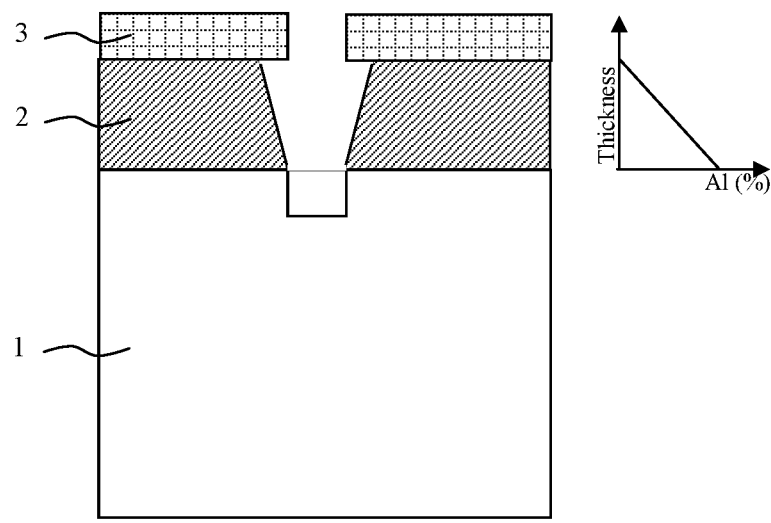
Figure 4F:
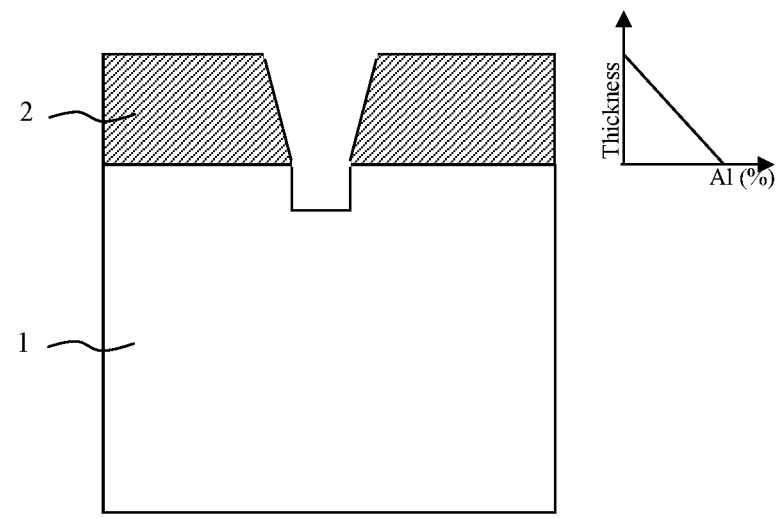
Figure 4G:
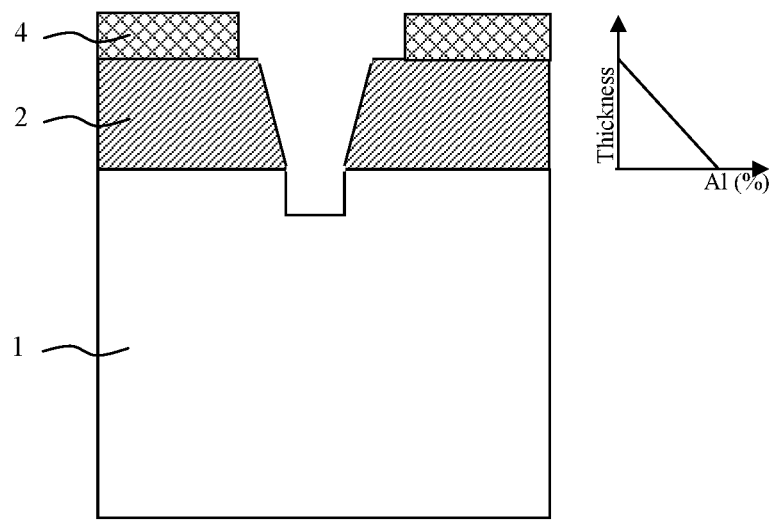
Figure 4H:
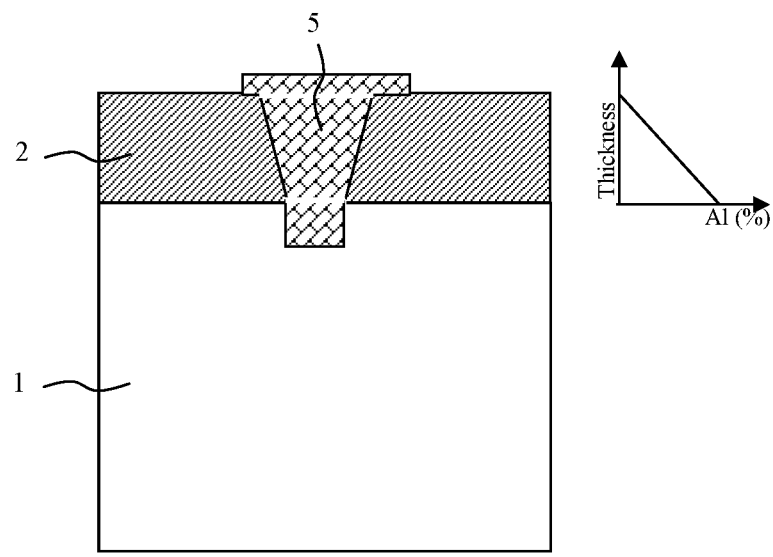

FIG. 4H shows a schematic structural view of a semiconductor device according to the second embodiment of the present invention. As shown in FIG. 4H, a semiconductor device according to the second embodiment is substantially the same as that according to the first embodiment, except that the groove is extended into the semiconductor device active region.

As shown in FIGS. 4A-4H, a method of manufacturing a semiconductor device according to this embodiment comprises:

providing a semiconductor device active region 1, as shown in FIG. 4A;

forming an electrode shape controlling layer 2 on the semiconductor device active region 1, the content of aluminum in the electrode shape controlling layer 2 being reduced in a direction from bottom to up, the reduction being linear reduction, an electrode region being disposed on the electrode shape controlling layer, as shown in FIG. 4B;

applying a first mask layer 3 on the electrode shape controlling layer 2, and exposing the electrode region through photolithography, as shown in FIG. 4C;

etching the electrode region on the electrode shape controlling layer 2 so as to form a groove penetrating through the electrode shape controlling layer 2, the shape of the groove varying based on change of the content of aluminum in the electrode shape controlling layer 2, the feature size of the groove being adjustable by an etching process, as compared with the feature sizes by photolithography, the feature size of the groove being slightly larger, as shown in FIG. 4D, or slightly smaller than the feature size by photolithography;

etching a part of the semiconductor device active region near the groove so as to form the groove extended into the semiconductor device active region 1, as shown in FIG. 4E;

removing the first mask layer 3, as shown in FIG. 4F;

applying a second mask layer 4 through photolithography to expose the electrode region, as shown in FIG. 4G; and depositing the electrode, removing the second mask layer 4 to form an electrodes 5, as shown in FIG. 4H.

Except for the above description, the structure and manufacturing method of the semiconductor device according to the second embodiment are the same as those according to the first embodiment, and repeated description will be omitted herein.

The Third Embodiment

Figure 5:
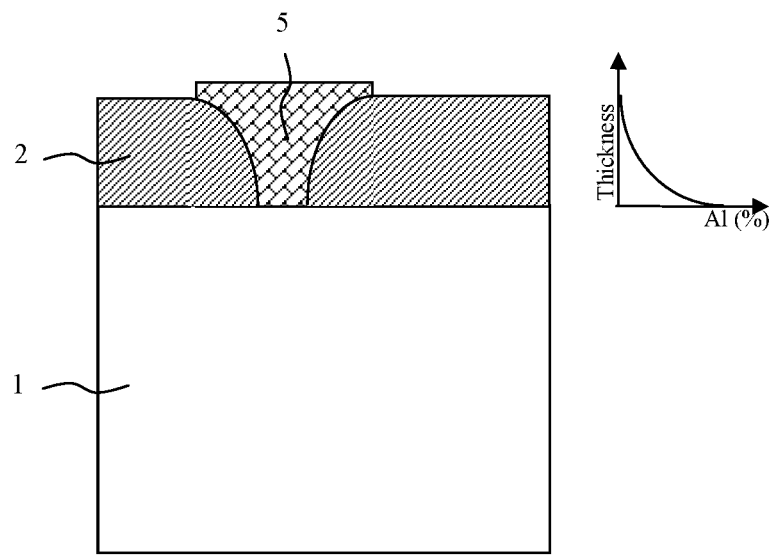
FIG. 5 is a schematic view of a semiconductor device according to a third embodiment of the present invention.

FIG. 5 shows a schematic view of a semiconductor device according to the third embodiment of the present invention.

In this embodiment, the content of aluminum in the electrode shape controlling layer 2 is gradually reduced from bottom to up, and the reduction is accelerating reduction. The other aspects of this embodiments are the same as those of the first embodiment and repeated description will be omitted herein.

In this embodiment, the content of aluminum in the electrode shape controlling layer 2 is gradually reduced from bottom to up, and the reduction is accelerating reduction. Sides of the groove are convex slopes protruded toward a central line of the groove. After deposition of the electrode, the electrode has a cross-sectional shape matching the sides of the groove, so that the electric field distribution at the edges of the electrode is changed and the electric field distribution becomes gentle.

The Fourth Embodiment

Figure 6:
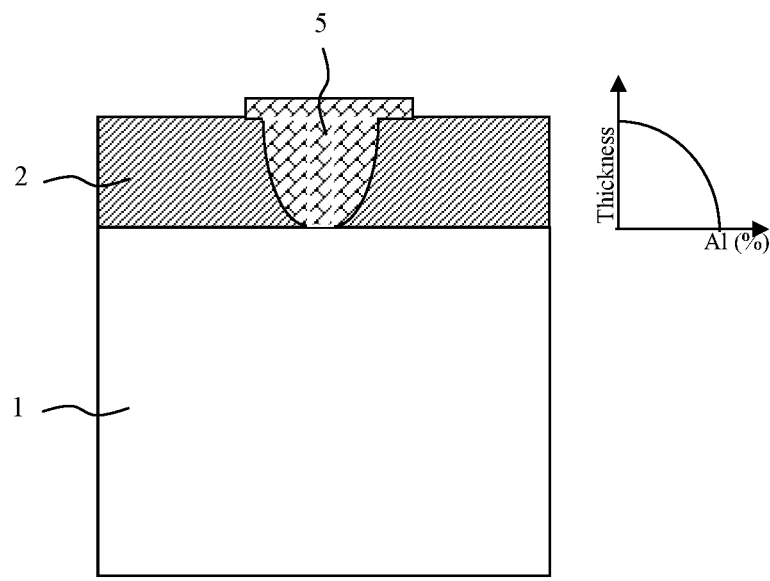
FIG. 6 is a schematic structural view of a semiconductor device according to a fourth embodiment of the present invention.

FIG. 6 shows a schematic view of a semiconductor device according to the fourth embodiment of the present invention.

In this embodiment, the content of aluminum in the electrode shape controlling layer 2 is gradually reduced from bottom to up, and the reduction is decelerating reduction. The other aspects of this embodiment are the same as those of the first embodiment and repeated description will be omitted herein.

In this embodiment, the content of aluminum in the electrode shape controlling layer 2 is gradually reduced from bottom to up, and the reduction is decelerating reduction. Sides of the groove are concave slopes protruded away from a central line of the groove, and the etching cross-section has a U shape. After deposition of the electrode, the electrode has a cross-sectional shape of U shape, so that the electric field distribution at the edges of the electrode is changed and the electric field distribution becomes gentle.

The Fifth Embodiment

Figure 7:
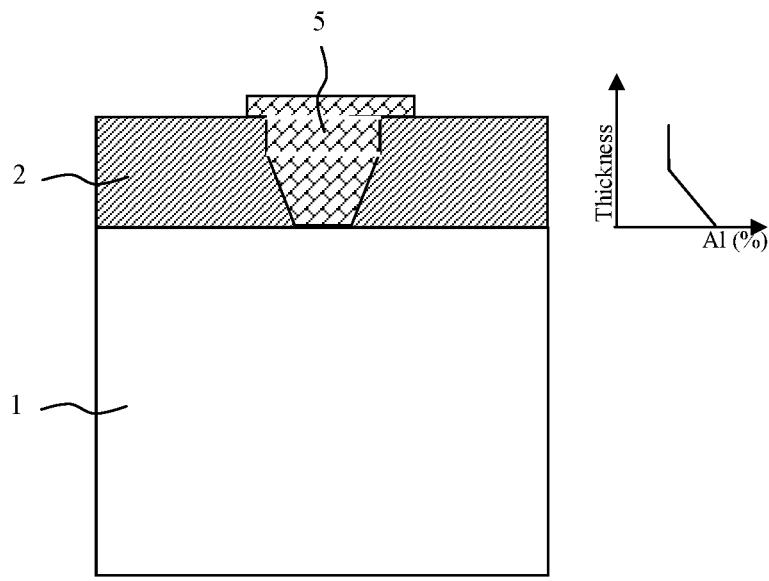
FIG. 7 is a schematic structural view of a semiconductor device according to a fifth embodiment of the present invention.

FIG. 7 shows a schematic view of a semiconductor device according to the fifth embodiment of the present invention.

In this embodiment, the content of aluminum in the electrode shape controlling layer 2 is linearly reduced firstly and then maintains unchanged from bottom to up. The other aspects of this embodiment are the same as those of the first embodiment and repeated description will be omitted herein.

In this embodiment, the content of aluminum in the electrode shape controlling layer 2 is linearly reduced firstly and then maintains unchanged. The groove includes two parts, the lower part thereof has a shape of trapezoid and the upper part thereof has a shape of rectangle. The etching cross-section has the same shape as that of the groove. After deposition of the electrode, the electrode has a cross-section shape the same as that of the etching cross-section.

The Sixth Embodiment

Figure 8:
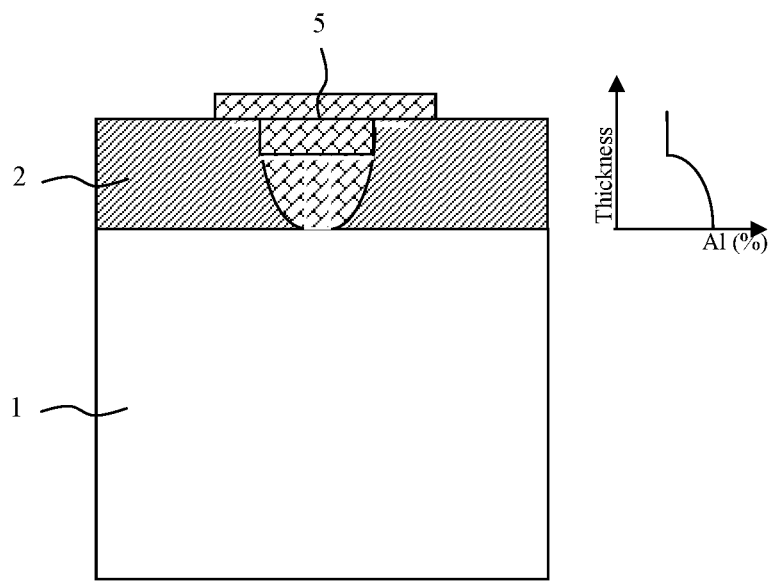
FIG. 8 is a schematic structural view of a semiconductor device according to a sixth embodiment of the present invention.

FIG. 8 shows a schematic view of a semiconductor device according to the sixth embodiment of the present invention.

In this embodiment, the content of aluminum in the electrode shape controlling layer 2 is decreasingly reduced firstly and then maintains unchanged from bottom to up. The other aspects of this embodiment are the same as those of the first embodiment and repeated description will be omitted herein.

In this embodiment, the content of aluminum in the electrode shape controlling layer 2 is decreasingly reduced firstly and then maintains unchanged. The groove includes two parts, the lower part thereof has a U shape and the upper part thereof has a shape of rectangle. The etching cross-section has the same shape as that of the groove. After deposition of the electrode, the electrode has a cross-section shape the same as that of the etching cross-section.

The Seventh Embodiment

Figure 9:
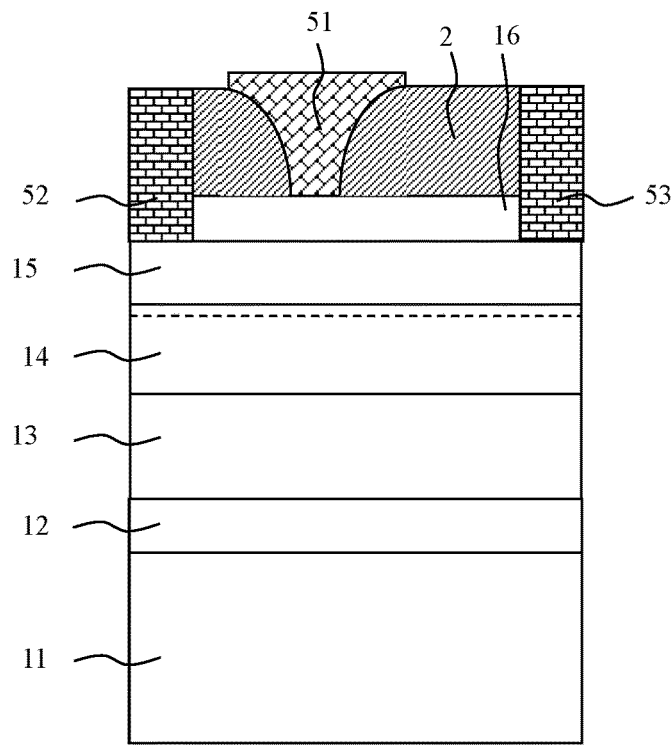
FIG. 9 is a schematic structural view of a semiconductor device according to a seventh embodiment of the present invention.

FIG. 9 shows a schematic view of a semiconductor device according to the seventh embodiment of the present invention.

A semiconductor device active region according to this embodiment is a nitride high electron mobility transistor, comprising a nucleation layer 12 grown on a substrate 11 which can be any type, a nitride buffer layer 13 grown on the nucleation layer 12, a nitride channel layer 14 grown on the nitride buffer layer 13, a nitride barrier layer 15 grown on the nitride channel layer 14, and a nitride capping layer 16 grown on the nitride barrier layer 15.

An electrode 51 is a gate electrode, an electrode 52 and an electrode 53 are an ohmic contacting source electrode and an ohmic contacting drain electrode respectively. The content of aluminum in the electrode shape controlling layer 2 is gradually reduced from bottom to up, and the reduction is accelerating reduction. Thus a part of the electrode 51 which is located inside the electrode shape controlling layer 2 has a shape of convex slopes.

The Eighth Embodiment

Figure 10:
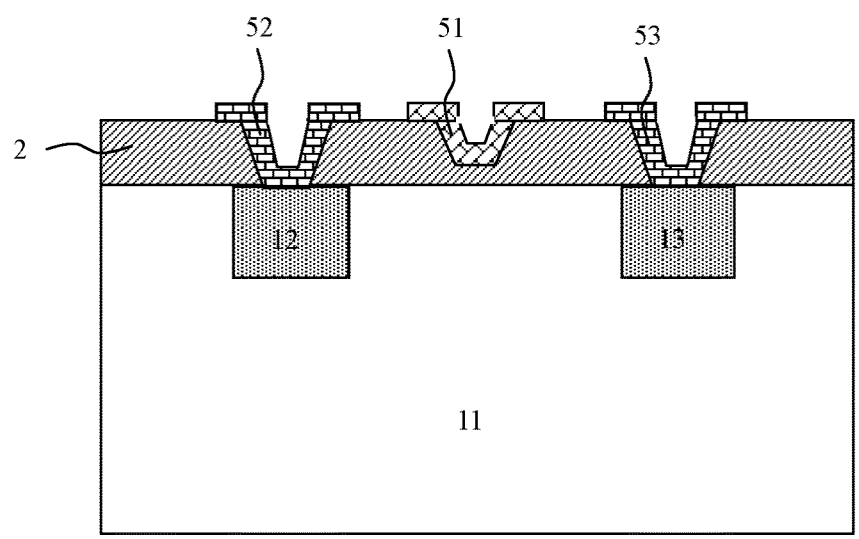
FIG. 10 is a schematic structural view of a semiconductor device according to an eighth embodiment of the present invention.

FIG. 10 shows a schematic view of a semiconductor device according to the eighth embodiment of the present invention.

In this embodiment, the semiconductor device active region is an N-channel enhancement mode MOSFET including two highly doped N+ regions 12 and 13 on a P-type substrate 11. The electrode shape controlling layer 2 is a dielectric layer in which the content of aluminum is gradually reduced from bottom to up, and the reduction is linear reduction. An electrode 51 is a gate electrode, an electrode 52 is a source electrode and an electrode 53 is a drain electrode.

The Ninth Embodiment

Figure 11:
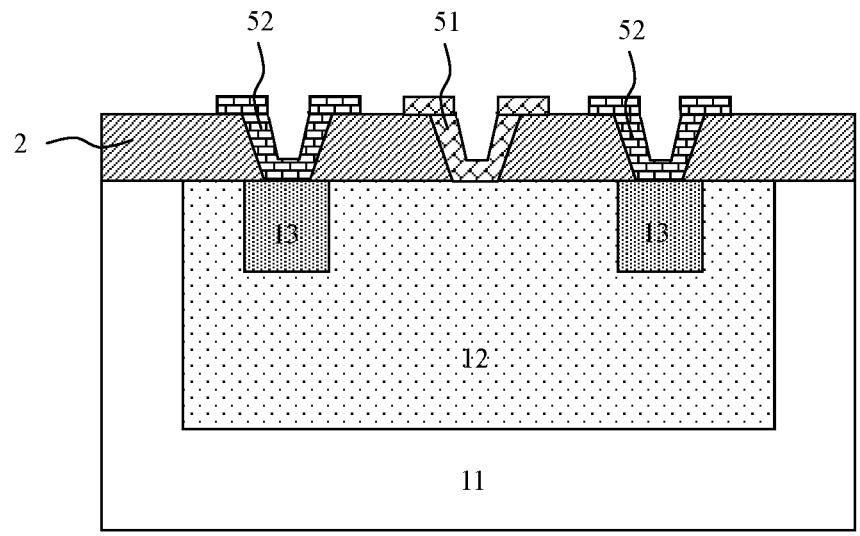
FIG. 11 is a schematic structural view of a semiconductor device according to a ninth embodiment of the present invention.

FIG. 11 shows a schematic view of a semiconductor device according to the ninth embodiment of the present invention.

In this embodiment, the semiconductor device active region is a Schottky diode manufactured with a common CMOS process, including an N-type layer 12 on a P-type substrate 11 and an N+ cathode layer 13 on the N-type layer 12. The electrode shape controlling layer 2 is a dielectric layer in which the content of aluminum is gradually reduced from bottom to up, and the reduction is linear reduction. An electrode 51 is an anode electrode and an electrode 52 is a cathode electrode.

The Tenth Embodiment

Figure 12:
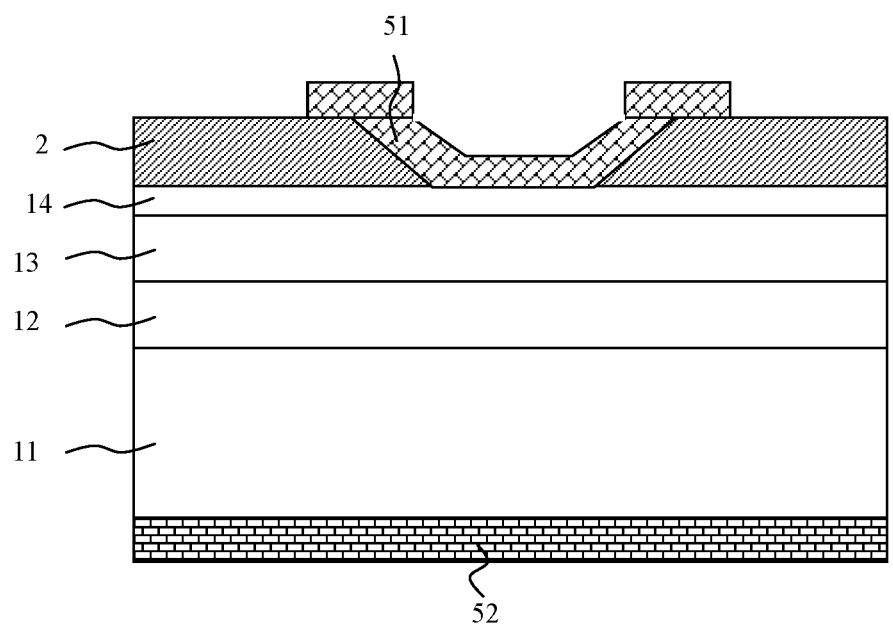
FIG. 12 is a schematic structural view of a semiconductor device according to a tenth embodiment of the present invention.

FIG. 12 shows a schematic view of a semiconductor device according to the tenth embodiment of the present invention.

In this embodiment, the semiconductor device active region is a PN diode having a vertical structure, including a semiconductor N+ layer 12 on a substrate 11, a semiconductor I layer 13 on the semiconductor N+ layer 12, and a semiconductor P+ layer 14 on the semiconductor I layer 13. The electrode shape controlling layer 2 is a dielectric layer in which the content of aluminum is gradually reduced from bottom to up, and the reduction is linear reduction. An electrode 51 is an anode electrode and an electrode 52 is a cathode electrode.

As can be seen from the above-described embodiments, in the semiconductor devices and manufacturing methods thereof according to the present invention, an electrode shape controlling layer is added on the semiconductor device active region, and the content of aluminum in the electrode shape controlling layer varies based on change of thickness. By controlling change of the content of aluminum in the electrode shape controlling layer, the ratio of the horizontal etching speed to the vertically etching speed is controlled in the etching process, so that the etching cross-sectional shape is changed in the etching process. In this way, shapes of electrodes can be controlled during the process of manufacturing the electrodes, control of various shapes of electrodes can be realized in the processes.

Since the etching speed is controlled by the material, there is no need to change the process parameters in the etching process, so good controllability, repeatability and simplicity can be realized. In addition, some particular shapes which cannot be realized with current etching processes can be realized with this invention. By controlling the shapes of the electrodes, distribution of electric field intensity near the electrodes is changed, therefore performances of the semiconductor device, such as breakdown voltage and reliability, are improved.

It will be understood by those skilled in the art that the present invention is not limited to the exemplary embodiments, rather, this invention may be realized with other specific forms without departing from the spirit or features of the present invention. Therefore, the embodiments should be considered as exemplary, not limitative. The scope of the present invention is defined by the appended claims rather than the foregoing description. This invention is intended to cover all modifications included within the spirit and scope of the appended claims and the equivalent arrangements. Any reference numeral in the claims should not be considered as limitation to the claims.

Further, it will be understood that although various embodiments are described in the specification, it does not mean that each embodiment contains only one separate technical scheme. This description manner is just for clarity, the specification should be considered as a whole by those skilled in the art. The technical schemes in various embodiments may be combined to form other embodiments understood by those skilled in the art.

What is claimed is:

1. A semiconductor device, comprising:
a semiconductor device active region;
an electrode shape controlling layer disposed on the semiconductor device active region, the electrode shape controlling layer containing aluminum, the content of aluminum in all or part of the electrode shape controlling layer being changed in a direction from bottom to up from the semiconductor device active region;
an electrode region disposed on the electrode shape controlling layer, the electrode region including a groove extended toward the semiconductor device active region and penetrating through the electrode shape controlling layer longitudinally, all or part of a side surface of the groove having a shape corresponding to the content of aluminum in the electrode shape controlling layer; and
an electrode disposed in the groove in the electrode region entirely or partially, the electrode having a shape matching with the shape of the groove, a bottom portion of the electrode being contacted with the semiconductor device active region.

2. The semiconductor device according to claim 1, wherein the content of aluminum in all or part of the electrode shape controlling layer is reduced in a direction from bottom to up from the semiconductor device active region, and all or part of the side surface of the groove has a shape of one of a straight slope, a concave slope protruded away from a central line of the groove and a convex slope protruded toward the central line of the groove.

3. The semiconductor device according to claim 2, wherein the electrode shape controlling layer is a semiconductor layer or a first dielectric layer, the first dielectric layer is formed of one of SiN, SiAlN, SiAlGaN, SiAlOx, AlMgON and HfAlOx or a combination thereof.

4. The semiconductor device according to claim 3, wherein a semiconductor layer in the semiconductor device active region and the semiconductor layer in the electrode shape controlling layer are formed of one of Group III nitride, silicon, germanium, silicon germanium, III-IV compound and oxide or a combination thereof.

5. The semiconductor device according to claim 2, wherein the electrode shape controlling layer is a combination of a semiconductor layer and a first dielectric layer, the first dielectric layer is located above the semiconductor layer, the content of aluminum at any position of the semiconductor layer is greater than that at any position of the first dielectric layer, and the first dielectric layer is formed of one of SiN, SiAlN, SiAlGaN, SiAlOx, AlMgON and HfAlOx or a combination thereof.

6. The semiconductor device according to claim 5, wherein the semiconductor layer in the semiconductor device active region and the semiconductor layer in the electrode shape controlling layer are formed of one of Group III nitrite, silicon, germanium, silicon germanium, III-IV compound and oxide or a combination thereof.

7. The semiconductor device according to claim 2, wherein the content of aluminum in all or part of the electrode shape controlling layer is reduced in the direction from bottom to up from the semiconductor device active region in a manner of one of linear reduction, accelerating reduction, decelerating reduction, initial linear reduction and then remaining unchanged, initial decelerating reduction and then remaining unchanged, and initial accelerating reduction and then remaining unchanged.

8. The semiconductor device according to claim 1, wherein the groove in electrode shape controlling layer is extended into the semiconductor device active region.

9. The semiconductor device according to claim 1, wherein a second dielectric layer is deposited on all or part of inner walls of the groove in the electrode shape controlling layer and a surface of the electrode shape controlling layer, the electrode is located on the second dielectric layer entirely or partially, the second dielectric layer is formed of one of $Al_2O_3$, AlON, SiN, SiON, $SiO_2$, HfAlOx, $HfO_2$ or a combination thereof.

10. The semiconductor device according to claim 1, wherein the semiconductor device is a diode, the electrode is an anode electrode or a cathode electrode of the diode; or the semiconductor device is a transistor, the electrode is one of a source electrode, a drain electrode and a gate electrode of the transistor.

11. The semiconductor device according to claim 1, wherein the semiconductor device active region comprises one of a high electron mobility transistor having an aluminum gallium nitride/gallium nitride heterojunction structure, a high electron mobility transistor having an aluminum gallium indium nitrogen/gallium nitride heterojunction structure, a high electron mobility transistor having a nitride aluminum/gallium nitride heterojunction structure, a gallium nitride MOSFET, a multi quantum well device having indium gallium nitride/gallium nitride, a light emitting diode made of p-type nitride, a UV-LED, a photodetector, a hydrogen generator, a solar cell, an LDMOS, a UMOSFET, a diode, a Schottky diode and an avalanche breakdown diode.

12. A method of manufacturing a semiconductor device, comprising:
S1. providing a semiconductor device active region;
S2. forming an electrode shape controlling layer on the semiconductor device active region, the electrode shape controlling layer containing aluminum, the content of aluminum in all or part of the electrode shape controlling layer being changed in a direction from bottom to up from the semiconductor device active region;
S3. disposing an electrode region on the electrode shape controlling layer; forming a groove extended toward the semiconductor device active region and penetrating through the electrode shape controlling layer longitudinally in the electrode region, all or part of a side surface of the groove having a shape corresponding to the content of aluminum in the electrode shape controlling layer; and
S4. forming an electrode in the groove in the electrode region, the electrode being disposed in the groove in the electrode region entirely or partially, the electrode having a shape matching with the shape of the groove, a bottom portion of the electrode being contacted with the semiconductor device active region.

13. The method according to claim 12, wherein in step S2, the content of aluminum in all or part of the electrode shape controlling layer is reduced in a direction from bottom to up from the semiconductor device active region,
wherein in S3, all or part of the side surface of the groove has a shape of one of a straight slope, a concave slope protruded away from a central line of the groove and a convex slope protruded toward the central line of the groove.

14. The method according to claim 13, wherein steps S3 and S4 comprise:
S31. applying a first mask layer on the electrode shape controlling layer, and exposing the electrode region through photolithography;
S32. etching the electrode region so as to form the groove extended to the semiconductor device active region;
S33. removing the first mask layer;
S41. applying a second mask layer on the electrode shape controlling layer, exposing the electrode region through photolithography; and
S42. depositing the electrode, removing the second mask layer to form the electrode.

15. The method according to claim 13, wherein the electrode shape controlling layer is a semiconductor layer or a first dielectric layer, the first dielectric layer is formed of one of SiN, SiAlN, SiAlGaN, SiAlOx, AlMgON and HfAlOx or a combination thereof, and the first dielectric layer is grown with one of MOCVD, PECVD, LPCVD, MBE, CVD and GCIB.

16. The method according to claim 13, wherein the electrode shape controlling layer is a combination of a semiconductor layer and a first dielectric layer, the first dielectric layer is located above the semiconductor layer, the content of aluminum at any position of the semiconductor layer is greater than that at any position of the first dielectric layer, the first dielectric layer is formed of one of SiN, SiAlN, SiAlGaN, SiAlOx, AlMgON and HfAlOx or a combination thereof, and the first dielectric layer is grown with one of MOCVD, PECVD, LPCVD, MBE, CVD and GCIB.

17. The method according to claim 13, wherein the content of aluminum in all or part of the electrode shape controlling layer is reduced in the direction from bottom to up from the semiconductor device active region in a manner of one of linear reduction, accelerating reduction, decelerating reduction, initial linear reduction and then remaining unchanged, initial decelerating reduction and then remaining unchanged, and initial accelerating reduction and then remaining unchanged.

18. The method according to claim 12, before step S4, the method further comprising:
depositing a second dielectric layer on all or part of inner walls of the groove in the electrode shape controlling layer and a surface of the electrode shape controlling layer.

19. The method according to claim 18, wherein the second dielectric layer is formed of one of $Al_2O_3$, AlON, SiN, SiON, $SiO_2$, HfAlOx, $HfO_2$ or a combination thereof.

20. The method according to claim 12, wherein the groove in the electrode shape controlling layer is extended into the semiconductor device active region.

* * * * *